United States Patent [19]
Shah et al.

[11] Patent Number: 5,214,570
[45] Date of Patent: May 25, 1993

[54] COMPACT MEMORY MODULE

[75] Inventors: Bhupendra C. Shah, Chelmsford; Charles F. Peterson, Berlin; Mark E. Buckley, Northbridge, all of Mass.

[73] Assignee: Clearpoint Research Corporation, Hopkinton, Mass.

[21] Appl. No.: 862,828

[22] Filed: Apr. 3, 1992

[51] Int. Cl.⁵ .............................................. H05K 1/11
[52] U.S. Cl. .................................... 361/412; 361/383; 361/384; 361/396; 361/400; 361/413
[58] Field of Search ............................ 361/383–384, 361/392, 396, 399, 400, 412, 413; 439/74, 75, 79, 80

[56] References Cited

U.S. PATENT DOCUMENTS

| 4,711,804 | 12/1987 | Burgess | 361/383 |
| 4,739,444 | 4/1988 | Zushi et al. | 361/383 |
| 4,780,792 | 10/1988 | Harris et al. | 361/412 |
| 4,953,060 | 8/1990 | Lauffer et al. | 361/396 |
| 4,998,180 | 3/1991 | McAuliffe et al. | 361/383 |
| 5,008,777 | 4/1991 | Burns | 361/412 |
| 5,099,394 | 3/1992 | Hood et al. | 361/412 |

FOREIGN PATENT DOCUMENTS 3733072  4/1989  Fed. Rep. of Germany ........ 439/74

OTHER PUBLICATIONS

Diagrams of Clearpoint VME VSB Board, made by Clearpoint before Mid 1990.

Primary Examiner—Gregory D. Thompson
Attorney, Agent, or Firm—Edward W. Porter

[57] ABSTRACT

A memory module includes a mother board with an edge connector mounted adjacent one of its edges. Memory chips are mounted on the same side of the mother board as the edge connector. A daughter board, having memory chips mounted on its surface facing the mother board, is connected to the mother board so that its maximum height above the mother board is substantially no greater than that of the edge connector. Preferably the memory chips are mounted in thin TSOP packages and the daughter board is connected to the mother board by two rows of mating electrical pins and sockets, one located near the edge connector and the other near the top of the mother board, so the daughter board is mounted over virtually all of the width of the mother board except that covered by the edge connector, and so that the rows of mating connectors and the facing surfaces of the mother and daughter boards form an air channel through which air can flow to cool the memory chips mounted between the mother and daughter boards. In the preferred embodiment, each of the chip bearing surfaces of the mother and daughter boards has an equal number of chips, and has separate lines from the module's driver circuits, causing the electrical characteristics of each chip bearing surface to be similar. In the preferred embodiment, pairs of memory circuit packages having mirrored input connectors are mounted next to each other on a common surface and have adjacent corresponding mirrored input and/or output connectors electrically connected to common pads on their printed circuit board.

14 Claims, 4 Drawing Sheets

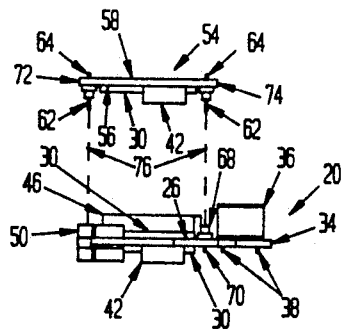
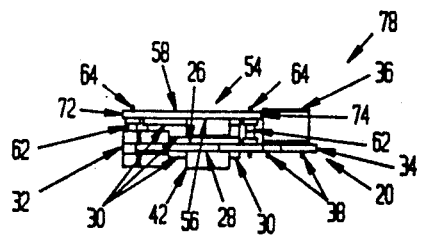
FIG. 5       FIG. 6
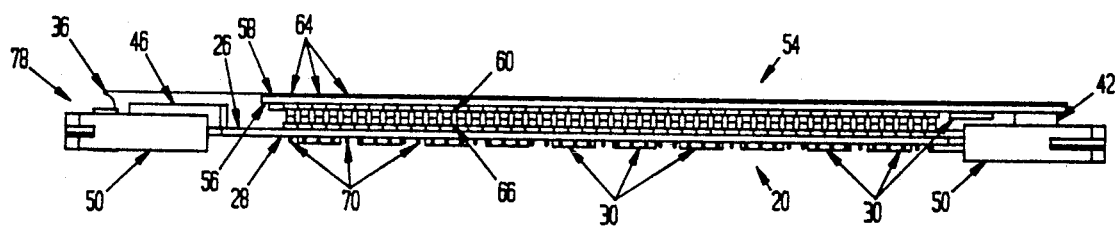
FIG. 7
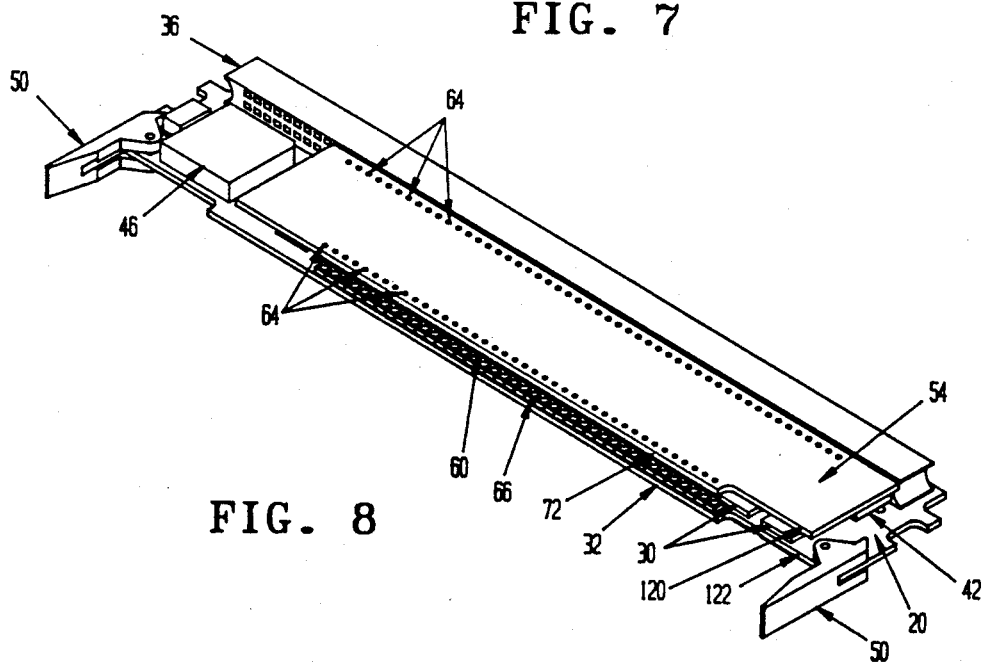
FIG. 8

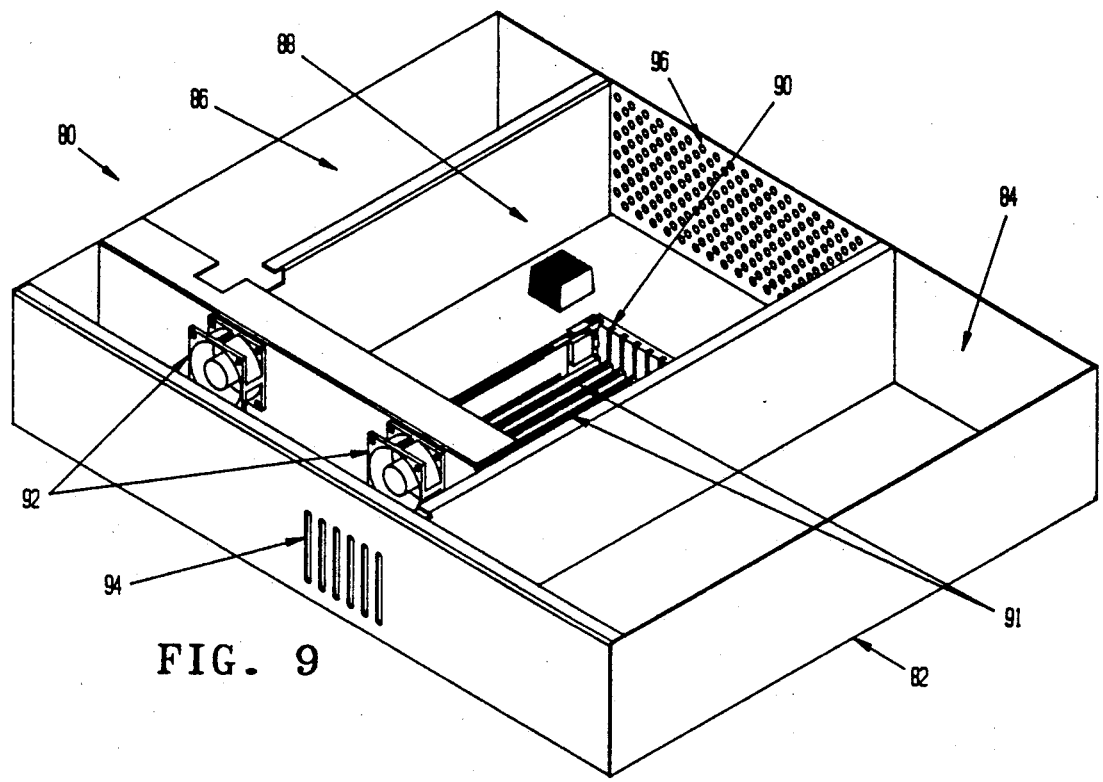
FIG. 9
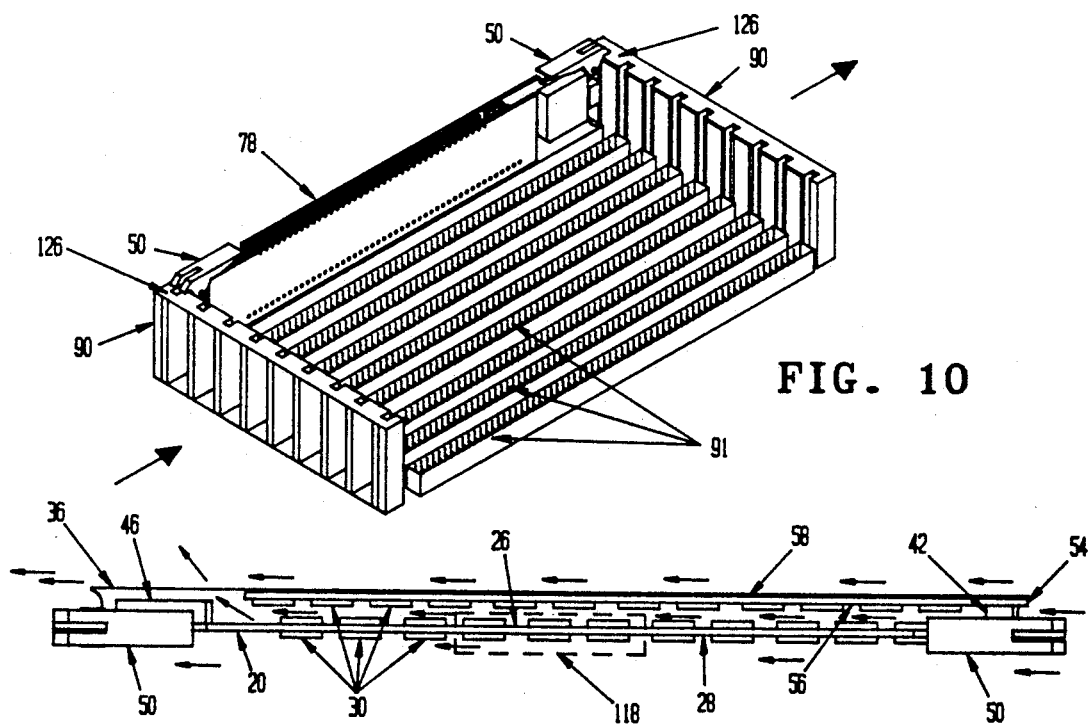
FIG. 10
FIG. 11

COMPACT MEMORY MODULE

FIELD OF THE INVENTION

The present invention relates to a compact memory module for use in digital computing devices, such as personal computers, or workstation computers. In particular, the present invention relates to a memory module which enables a relatively large amount of memory to be placed in a relatively small volume, such as the relatively small volume which is allowed for memory boards in certain personal computers, workstations, and other computing devices.

BACKGROUND OF THE INVENTION

There has been a constant trend in the computer industry of packing more and more computer power into ever smaller spaces. Part of this trend includes larger random access memories in such computers. Many computers enable memory to be added to them by means of add-on memory cards. Usually such computers have attached to their bus one or more bus connectors into which such a memory, or other add-on card can be plugged. Usually a plurality of such connectors are placed next to each other so that a memory, or other add-on, card can be inserted in each. When this is the case, each such bus connector has associated with it what is known as a "card slot", that is, a pre-defined space into which such an add-on card can be inserted.

Such a card slot normally has a pre-defined length, width, and height. If the card exceeds the pre-defined length of the card slot, it will not normally fit within the card guides which are designed to hold the card at both ends. If a card inserted into such a bus connector sticks up out of the bus connector by more than the pre-defined height associated with the card slot, it may not fit in the bus connector's associated computer system. If the card is thicker than the dimension associated with the connector's slot, it may stick into the space of the slot associated with an adjacent connector, making it impossible to insert a card into that adjacent connector's slot. Thus, it can be seen that it is desirable to keep add-on cards within the pre-defined height, width, and thickness requirements established for the type of card slot into which it is to be inserted.

The problem, however, is that computer users want to pack ever larger amounts of memory into their computers. Since their computers usually only have a limited number of slots, that means there is a demand for memory cards which can pack a large amount of memory into the dimensions of a given card slot. To satisfy this need it has been common in the prior art to increase the density of memory boards by placing memory chips on both sides of such boards.

Another techniques, which has been used in the prior art to increase the density of memory boards, is to create memory boards which are actually comprised of two separate printed circuit boards, a so-called mother board, and a so-called daughter board, which is mounted on, and electrically connected to, the mother and daughters boards. Such a combination of mother and daughter boards provides an increased area upon which chips can be mounted, and thus increases the number of chips which can be included in a memory board, but it often results in a memory board which is too thick to fit within the width of an individual card slot. Such an oversized memory board, in effect, often ends up using the space allocated for two slots, and thus does not properly solve the problem of increasing the total amount of memory which can be placed in the limited number of slots which most computers have.

One of the reasons why prior art modules which include both mother and the daughter card are relatively thicken is the need to provide adequate cooling to the memory chips located between the mother and the daughter cards.

Another factor that traditionally adds thickness to such memory modules is the fact that daughter cards are traditionally attached to their mother cards by means of screws or nuts on the outside of the daughter cards. Unfortunately, these screws and nuts add to the overall thickness of the memory module.

Another factor which tends to decrease the amount of memory chips that can be placed on a given memory board or module is the fact that normally each separate pin of each separate memory chip has to have a separate electrical contact in the printed circuit board to which it is to be attached and soldered or otherwise electrically connected. The requirement of having a separate electrical pad for every pin on every chip not only increases the amount of surface area that is required to mount chips, but also increases the complexity of the electrical wiring contained within the printed circuit board on which such memory chips are mounted.

SUMMARY OF THE INVENTION

It is an object of the present invention to provide a memory module which enables a relatively large number of memory chips to be packaged within the volume associated with a given card slot.

It is another object of the present invention to provide a memory module containing both a mother board and a daughter board which carries a relatively large number of memory chips without overheating.

It is yet another object of the present invention to provide a memory module containing a mother board and a daughter board which performs the functions of reading and writing data within desired timing requirements.

It is a yet further object of the present invention to provide a memory module in which integrated circuit chips can be placed closer together than normal, and in which the wiring of the printed circuit board on which such memory chips are mounted can be simplified.

According to the present invention a memory module is provided which includes a mother board with an edge connector mounted adjacent one of the board's edges. Memory chips are mounted on the same side of the mother board as the edge connector. A daughter board, having memory chips mounted on its surface facing the mother board, is electrically and physically connected to the mother board so that the maximum height the daughter board sticks up above the side of the mother board on which the edge connector is mounted is substantially equal to that which the edge connector sticks up above that side, so the daughter board does not cause the mercury board to be substantially any thicker than the combination of the mother board and its edge connector, enabling the module not to interfere with the placement of cards in adjacent card slots.

In a preferred embodiment, the daughter board is electrically and physically connected to the mother card by two rows of mating electrical pins and sockets. It is preferred that the daughter board have no chips mounted on its surface which faces away from the mother board, that the memory chips mounted on both the mother and daughter board be mounted in ISOP chip packages, and that the daughter card be executed over virtually all of the width of the mother card from the edge connector to the mother board's top edge. Preferably the rows of pins and sockets which connect the mother and daughter boards are located at the two edges of the daughter board the edge connector and the top edge of the mother board, and the memory chips on both the mother and daughter board are executed between the two rows, so that the mother and daughter board and the rows of mating connectors tend to form an air channel through which air can flow to cool the memory chips executed between the mother and daughter boards.

In the preferred embodiment each surface of the mother or daughter boards which has chips executed on it, has an equal number of chips, and has separate lines from the module's driver circuits, so as to cause the electrical characteristics of each chip bearing surface to be similar. In the preferred embodiment pairs of integrated memory circuit packages having mirrored input and/or output connectors are next to each other on a common surface and have adjacent corresponding mirrored input and/or output connectors electrically connected to common on their printed circuit board. Capacitors are not executed between the two chips of such pairs, but are executed between chips which do not have their corresponding, pins connected to common pads. It is also preferred that the daughter card have a cut out in its corner near the ejector lever of the which board, to make that ejector lever easier to reach.

DESCRIPTION OF THE DRAWINGS

These and other aspects of the present invention will become more evident upon reading the following description of the preferred embodiment in conjunction with the accompanying drawings, in which:

FIG. 5 shows an end view of the mother card shown in FIGS. 1 and 2 and of the daughter card shown in FIGS. 3 and 4, with dotted lines indicating the direction in which the daughter card should be moved to mate with the mother card;

FIG. 6 is an end view of what the memory module looks like when the mother card and the daughter card have been mated;

FIG. 7 is a top view of the memory module when these two memory boards have been mated;

FIG. 8 is a perspective view of the memory module with its two boards mated and with its ejection levers pulled up;

FIG. 9 is a perspective view of a computer system of a type for which the particular memory module shown in FIGS. 1-8 has been designed to be inserted into;

FIG. 10 is a perspective view of the card cage of the computer shown in FIG. 9;

FIG. 11 is a top view of the memory module, similar to that shown in FIG. 7, except that in it the connectors which electrically connect and hold the mother and daughter board together have been removed so that the relative placement of the memory chips on the two boards may be seen;

DETAILED DESCRIPTION OF THE PREFERRED EMBODIMENT

Figure 1:
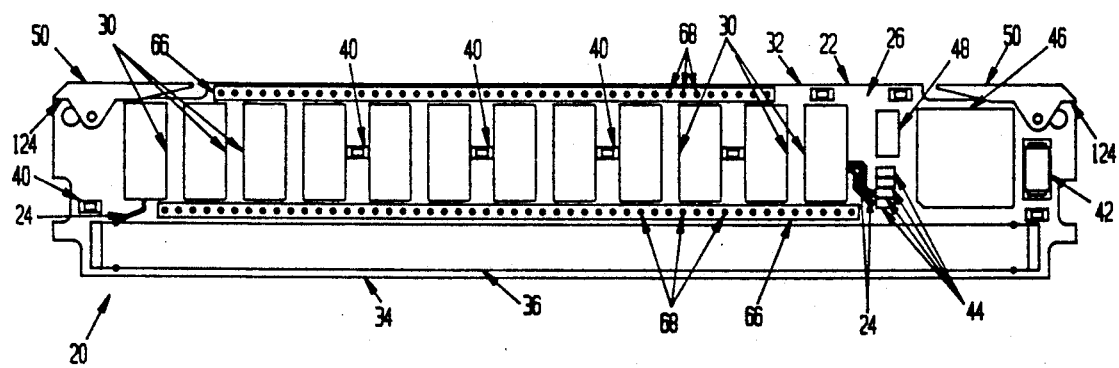
FIG. 1 is a view of the front major surface of the mother board of a memory module embodying the present invention.

Referring now to FIG. 1, the mother board 20 of a memory module embodying the present invention is shown. The mother board 20 is comprised of a printed circuit board 22 which contains electrical leads 24, only a portion of which are shown in FIG. 1. The mother board 20 contains two major surfaces, a front surface 26 shown in FIG. 1, and a back surface 28 shown in FIG. 2. On each of these major surfaces twelve memory chips 30 are mounted. These memory chips are mounted in so-called TSOP packages, with the letters TSOP standing for Thin, Small, Outline Package. TSOP packages are very flat, enabling a mother board, such as the mother board 20, having them mounted on both sides, to have a relatively narrow thickness.

As can be seen from FIG. 1, the mother board 20 has an elongated, roughly rectangular, shape with two parallel long edges 32 and 34, at its top and bottom, respectively. Adjacent to the bottom of these two edges, the edge 34, an edge connector 36 is mounted on the mother boards front major surface 26. The edge connector 36 is physically and electrically connected to the mother board by means of 130 pins 38, shown in FIG. 2, which extend through and are soldered into so-called "through hole" connections in the printed circuit board 20. As can be seen in FIG. 1, the edge connector 36 is an elongated structure which is mounted with long axis adjacent to and parallel to the bottom long its edge 34. In the preferred embodiment, this edge connector is a female edge connector designed to mate with a corresponding male edge connector on the mother board of a Hewlett-Packard Apollo Series 700 workstation computer. Each of the edge connector's 130 female sockets contains an electrical contact which is connected to one of the pins 38. These pins, in turn, are electrically connected to the leads 24 contained within the printed circuit board.

Mother board 20 further has mounted on it a plurality of small capacitors 40 and several larger capacitors 42 which are used to smooth out transients in the voltage supply caused by the rapid switching which takes place in the circuits of the memory module. The mother board also has mounted on it a plurality of small resistors 44. In addition to these capacitors and resistors, which are considered passive electrical components, there are two types of chips, in addition to memory chips, which contain active electronic components. These include a bus interface chip 46, and several driver chips 48. The driver chips 48 amplify signals from the bus onto which the memory module is designed to be connected, and it supplies those amplified signals to the memory chips 30. The bus interface chip 46 contains logic to decode the bus protocol used on that bus and supplies resulting timing and control signals to the drivers 48, which determine when the drivers supply such amplified bus signals to the memory chips 30.

Figure 2:
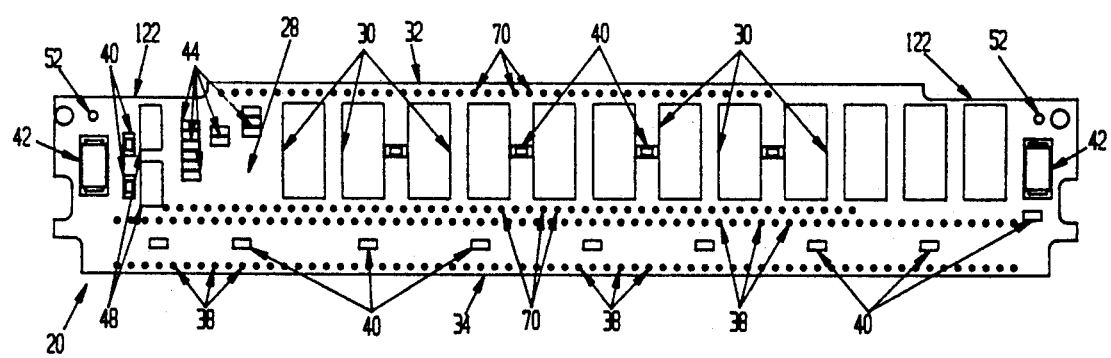
FIG. 2 is a view of the back major surface of the mother board shown in FIG. 1.

The motherboard 20 also contains two ejection levers 50, shown in FIG. 1, which are mounted to pivot about the ejection lever holes 52 shown in FIG. 2. As will be explained below, these ejection levers are used to help remove the memory module from its card slot.

Figure 3:
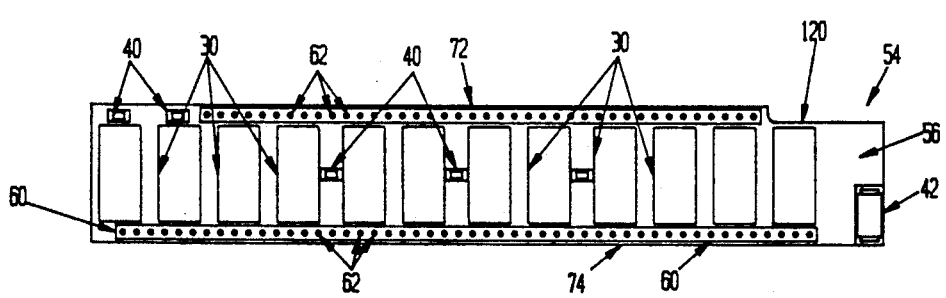
FIG. 3 is a view of the daughter board used in conjunction with the mother board shown in FIGS. 1 and 2, showing the major surface of the daughter board which faces toward the mother board when the two are connected to form a memory module embodying the present invention.
Figure 4:
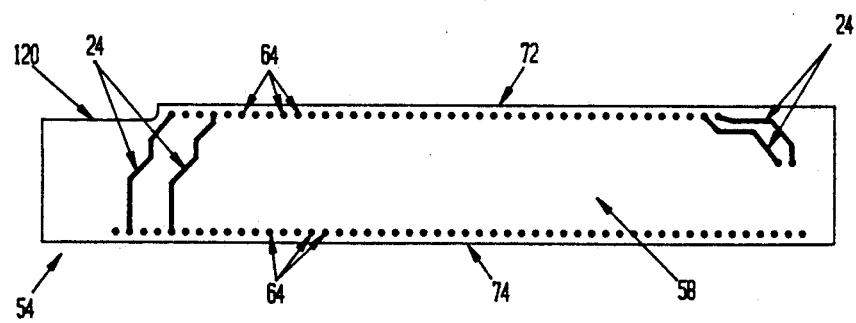
FIG. 4 shows the opposite major surface of the daughter card from that shown in FIG. 3.

Referring now to FIGS. 3 and 4, the daughter board 54 of the memory module is shown. The daughter board 54 is comprised of a printed circuit board which has two major surfaces. A first major surface 56 which faces the mother board when the memory module is assembled, and a second, or back, major surface 58 which faces away from the mother board when the module is assembled. The daughter board has 12 memory chips 30 packaged in the same TSOP packages as those mounted on the mother board and it contains capacitors 40 similar to those used on the mother board. All the memory chips on the daughter board are mounted on its first surface 56. None are mounted on its second surface 58. The printed circuit board on which the daughter board is made contains a plurality of electrical leads 24 which are used to connect its electrical components. For simplification only a small percent of these electrical leads are shown in the figures.

The mother card 20 and the daughter card 54 are both electrically and physically connected by two rows of mating socket terminal strips located on each board. The male socket terminal strips 60 located on the first surface 56 of the daughter card each comprise a row of male electrical connector pins 62, shown in FIG. 3. Each of these connecting pins has a corresponding through hole pin 64 which extends through, and is soldered to, the printed daughter circuit board so as to make electrical contact with the leads of that board. The through hole pins 64 can be seen sticking out through the back side of the daughter card in FIGS. 4, 5, 6, and 7.

The socket terminal strips located on the mother board 20 are female socket terminal strips 66, shown in FIGS. 1, 7, and 8. As is shown in FIG. 1, each of them includes a row of female sockets 68 into which the pins 62 of the male socket terminal strip on the mother board can mate. Each of the female sockets also includes a corresponding through hole connector pin 70 which extends through, and is soldered to, the mother printed circuit board of the mother board, as is indicated in FIGS. 2, 5, 6, and 7, so as to make electrical contact with the leads of that printed circuit board.

As can be seen from FIGS. 3 and 4, the two male socket terminal strips 60, located on the daughter board, are located near the top and bottom long parallel edges 72 and 74, respectively, of that daughter board. Similarly, the two corresponding female socket terminal strips 66 located on the mother board are placed adjacent to the top long edge 32 of that mother board and just above the edge connector 36 which is mounted adjacent to the bottom long edge 34 of that mother board. As will be explained below in greater detail, this placement of the corresponding socket terminal strips above and below the rows of memory chips 30 located on the facing surfaces of the mother and daughter board form an air channel through which air can pass to ventilate and cool the memory chips mounted between the mother and daughter board.

FIGS. 5 and 6 are end views of the mother and daughter board of the memory module. In FIG. 5 the daughter board is shown above, but not yet mated with, the mother board. Dotted lines 76 indicate the path which the pins 62 of the male socket terminal strip on the daughter board should travel in order to mate with the female socket terminal strip of the mother board. FIG. 6 shows the mother and daughter board once they have been mated to form the complete memory module. FIGS. 7 and 8 are a top view and a perspective view, respectively, of the memory module when the mother and daughter board are properly connected. As can be seen from FIGS. 6, 7, and 8, the daughter card 54 covers virtually all of the first surface of the mother board 20, except that portion which is covered by the edge connector 36, and that portion which is on the end of the mother board which carries the bus interface chip 46. As can be seen from FIG. 6, the daughter card 54 extends over substantially all of the height of the mother board, all the way from the top edge 32 of the mother board down to the edge connector 36. As can also be seen from that figure, the back surface 58 of the daughter card 54 sticks up from the front surface 26 of the mother board substantially no more than does the edge connector 36. In the preferred embodiment of the invention, the through hole pins 64 of the male socket terminal strips which stick out through the back surface 58 of the daughter board are filed down to prevent a portion of the daughter card from sticking up substantially any further from the front surface of the mother board than the edge connector 36. This enables the memory module to include all of the memory chips contained on the daughter board 54, without substantially increasing the overall thickness of the memory module, so that the module will not intrude into an adjacent card slot.

As can also be seen in FIGS. 6, 7, and 8, an air channel is formed between the facing surfaces of the mother board and the daughter board, and between the two rows of mating socket terminal strips, one of which is at the top edge of the memory module, and the other of which is adjacent to the 130 pin edge connector 36.

Referring now to FIGS. 9 and 10, the orientation and use of this air channel will be described in greater detail. FIG. 9 is a perspective view of a Hewlett-Packard Apollo Series 700 Workstation Computer 80, in which the memory module of the described preferred embodiment of the invention is designed to work. The computer 80 includes a metal casing 82 which includes a drive bay 84 in which hard disks and floppy disks can be placed, a power bay 86 in which a power supply can be placed, an area 88 in which the mother board of the workstation computer is located, and, in that area where the workstation's mother board is located, a card slot 90 in which memory modules of the type described above can be inserted and connected to the bus of the mother board.

As is shown in FIG. 9, the computer includes two fans 92, one of which is located at the front of the power bay 86, and the other of which is located at the front of the card slot 90. Air intake openings 94 are located at the front of the computer housing to enable air to enter the computer and be fed to the fans 92. The housing includes air exhaust holes 96 which enable the air blown by the fan to exit from the computer's casing. The fan 92 which is located immediately in front of the memory card cage 90, causes air to be blown in the direction shown by the arrows in FIG. 10.

Although it is not entirely clear from FIG. 10, the ends of the card cage 90 contain openings between the card guides, it provides for holding memory modules. These openings enable air to flow through the card guide in the direction shown by the arrows in FIG. 10. As can be seen from FIG. 10, this direction of airflow is parallel to the length of the 130 pin shrouded header bus connectors 91 which are used in the Apollo Series 700 Computer. Thus, it can be seen that when the memory module 78 of the present invention is inserted into a card slot in the card rack 90, as is shown in FIG. 10, the air channel which is defined between the opposing surfaces and the socket terminal strips of the mother and daughter boards will extend parallel to the direction of air flow indicated by the arrows in FIG. 10.

This is indicated in greater detail in FIG. 11, which shows a memory module with the socket terminal strips removed so that all of its memory chips can be seen. In this figure, arrows indicate the direction of air flow between the mother and daughter card. As is also shown in this figure, the memory chips 30 located on the daughter card 54 are somewhat offset relative to the location of the opposing memory chips 30 mounted on the mother board 20. This is done to increase the turbulence of the air flow through that channel and thus increase its cooling effect, not only upon the top surfaces of those chips, but also their side edges which are perpendicular to the printed circuit boards upon which they are mounted. This staggering also decreases the surface area of memory chip packages which is exposed to heat from the directly opposing surface of a memory chip package.

As can also be seen in FIG. 11, the air flow through the channel between the mother and daughter cards tends to direct air toward the bus interface chip 46, which, because it is a PAL chip using bipolar technology, tends to be the hottest chip in the memory module. As is shown in FIG. 11, this chip receives air flow after it has passed over the memory chips, so that whatever heat the bus interface chip adds to the air passing over it does not cause any of the memory chips to overheat.

Figure 12:
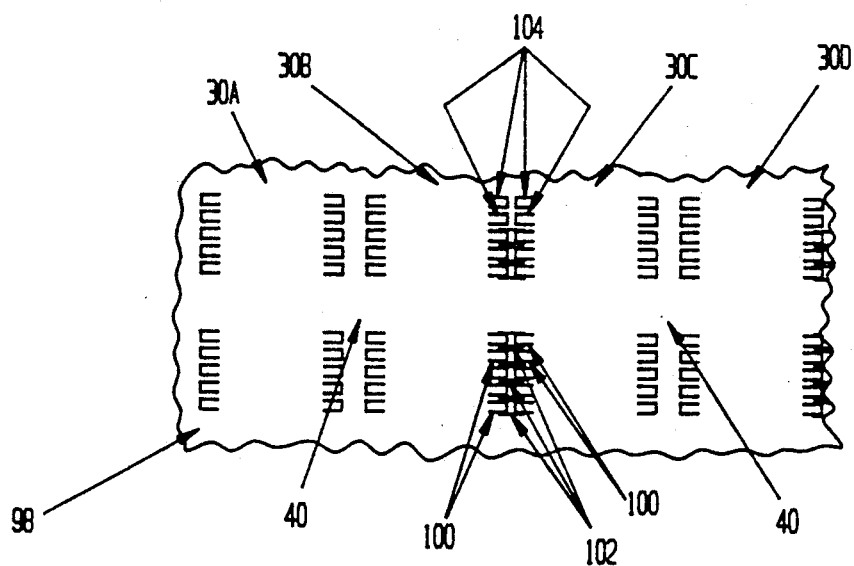
FIG. 12 is a close-up of a portion of one of the chip bearing surfaces of the memory module showing how pairs of adjacent chips share electrical contact pads on the surface of the printed circuit boards on which they are mounted.

Referring now to FIG. 12, a more detailed drawing of the manner in which the memory chips 30 are mounted upon the mother and daughter board of the memory module is shown. One innovative aspect of the present invention is the fact that it mounts the corresponding pins of a so-called pair of "mirrored" memory chips together, enabling those chips to be mounted closer together than would otherwise be possible. A pair of "mirrored" memory chips contain a regular chip, and a so-called "mirrored" chip. The pin-out, or placement of connector pins, of the so-called "mirrored" chip is such that if one placed a "mirrored" chip directly under a normal chip with its bottom facing the bottom of the normal chip, the signals associated with each of its pins would correspond to the signal associated with the pins of the normal chip which were directly above it. In other words, its pin out is equivalent to the mirror image of the pin out of the normal chip.

Pairs of such "mirrored" chips are normally used to enable memory chips to be mounted on opposite sides of a printed circuit board with their corresponding electrical pins directly on the other side of the printed circuit board from each other. This simplifies the electrical wiring required, since many of the corresponding pins of the "mirrored" pair of chips can share the same circuit lead placement, reducing the complexity of internal wiring.

In the preferred embodiment of the present invention, however, "mirrored" chips are used in a different manner. Instead of mounting a pair of "mirrored" chips one underneath the other on opposite sides of a printed circuit board, the preferred embodiment of the present invention mounts a pair of "mirrored" chips next to each other on a common surface of a printed circuit board, as is indicated in FIG. 12. In FIG. 12 the memory chips 30B and 30C have "mirrored" pin-outs. This means that their adjacent pins correspond to each other. Since it is common in memory designs to connect many of the corresponding pins of a group of memory chips to common leads, it thus is possible to connect many of the adjacent pins of these two chips. In FIG. 12, certain of the corresponding pins of the "mirrored" chips, such as the pins 100 are connected to common electrical pads 102 on the surface of the printed circuit board 98 on which they are mounted. Others such pins of the pair, such as the pins 104 shown in the FIG. 12, are not connected because they are pins which carry signals which are not shared among the memory chips of a given memory bank.

With memory chips in which all the adjacent pins of two "mirrored" chips could be directly connected, a great savings in space would result. The two chips could be mounted with all the pins on their two adjacent sides in direct contact with each other. In a situation like that shown in FIG. 12, where all but the top two corresponding pairs of pins between two chips can share electrical contacts, the chips can be mounted closer together than normal because as long as the top two pins 104 on each chip are properly separated the other eight pins facing each other on the two chips can touch. This means there is greater freedom to skew the bottom parts of the chips, as shown in FIG. 12, together, than would otherwise be the case. From a practical, manufacturing standpoint, this enables chips to be mounted more closely together.

As can also be seen from FIG. 12, in the preferred embodiment of the invention small capacitors 40 are placed between memory chips which do not have "mirrored" pins connected, since these chips have to be spaced further apart, anyway. But such capacitors are not placed between the chips which do have their "mirrored" pins connected since these chips are more closely mounted. This results in a very compact arrangement of memory chips and their associated capacitors.

Figure 13:
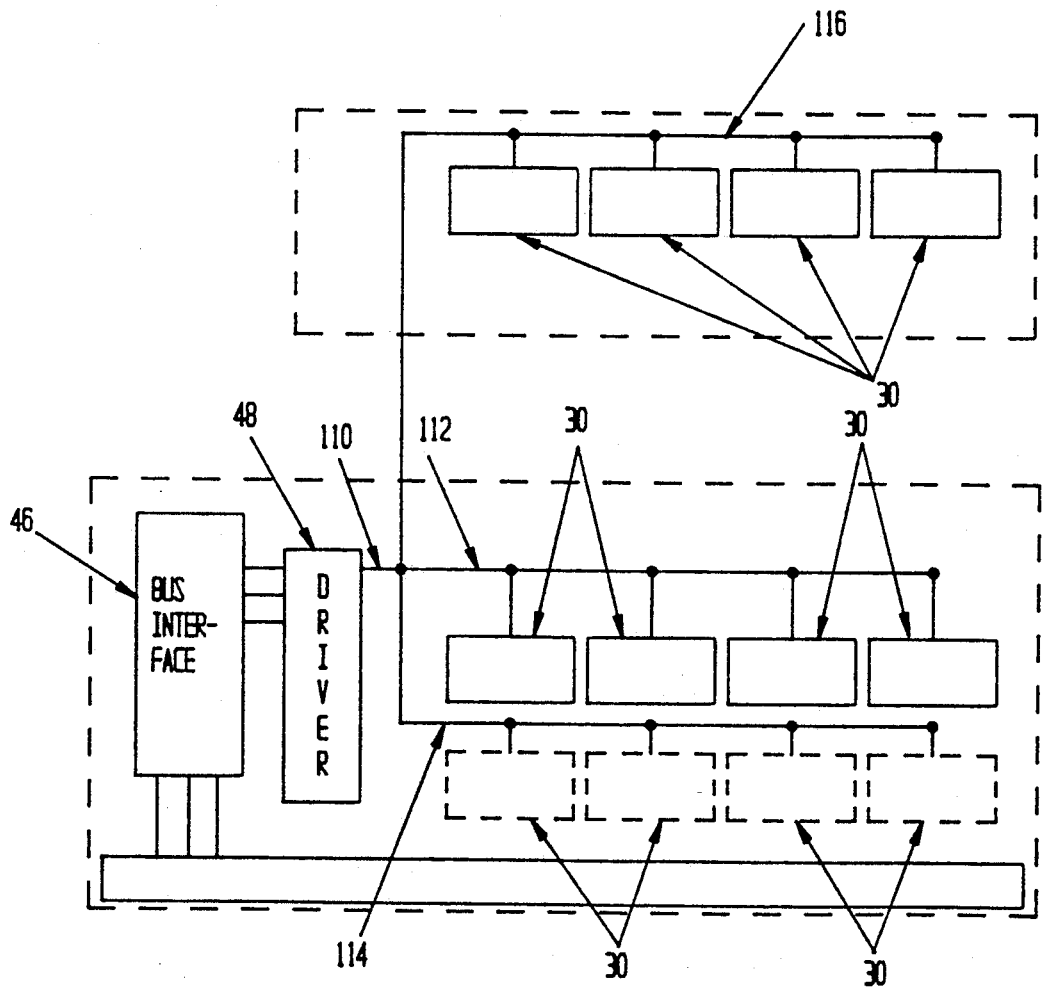
FIG. 13 is a highly simplified schematic electrical diagram showing how each chip-bearing surface of the memory module has its own branch of many major outputs from the module's IO drivers.

Referring now to FIG. 13, a simplified electrical schematic diagram is shown. This diagram shows how most driver outputs 110 produced by the driver chips 48 of the memory module have three separate branches: a branch 112 which is supplied to memory chips on the first surface of the mother board; a branch 114 which is supplied to memory chips on the second surface of the mother board and; a branch 116 which is supplied to the memory chips on the daughter board. This has the benefit of causing the same number of memory chips to be placed on each of the three branches 112, 114, and 116. This tends to make the inductive, capacitive, and resistive loading on each of the three branches relatively similar, thus causing the timing characteristics of each of the branches to be similar. Three such separate branches are used on all lines which are supplied to all of the memory chips in common. As those skilled in the art of designing memory boards will understand, this includes such lines as address lines, RAS lines, write enable lines, and output enable lines.

In the preferred embodiment the thirty six chips of the memory module are divided into two separately addressable banks, and thus the CAS line is divided into two branches, rather than three, one branch for each of the two banks. The first of these two banks includes all of the twelve memory chips on the daughter board plus the six chips on the mother board shown encircled in the dotted line 118 in FIG. 11.

Another feature of the invention can best be seen by looking at FIG. 8. As is shown in that figure, the daughter card 54 has a cutout 120 in its top edge 72. This cutout 120 matches the cutout 122 in the top edge 32 of the mother card. These two cutouts make it easier for a user of the memory module to pull up on the ejection levers 50, so as to pull those levers up into the position shown in FIG. 8. Pulling the ejection levers in this direction causes the bottom 124 of the ejection lever, shown in FIG. 1, to push down on the top surface 126 of the card cage 90 shown in FIG. 10, so as to eject the memory module. The presence of the cutout in the daughter card 54 enables that daughter card to cover a substantial portion of the mother card in the vicinity of the lever 50 shown in the lower right hand corner of FIG. 8 without blocking the ease of accessing that lever for the purposes of using it to remove the memory module from the card cage 90.

It should be understood that the foregoing description and drawings are given merely to explain and illustrate the invention, and the invention is not to be limited thereto, except in so far as the interpretation of the claims are so limited. Those skilled in the art who have the disclosure before them will be able to make modifications and variations therein, without departing from the scope of the invention. For example, it should be understood that the present invention could be used in different types of computers than the Hewlett-Packard Apollo Series 700 referred to in the above application. It should also be understood that many aspects of the invention could be used with other types of memory chip packaging technologies besides the TSOP packages described above. The invention could be used with a different number and configuration of memory chips than that described above. It can also be used with a different type of edge connector and a different type of means for connecting the mother and daughter board than that set forth in the specification.

What we claim is:

1. A memory module designed for use in a computing system which contains a system bus containing elongated bus connectors with which memory cards can be mated to electrically connect them to the bus, and a fan for generating an air flow in a direction parallel to the elongated dimension of said edge connectors, said memory module comprising:

a mother board;

a daughter board;

where both said mother and daughter boards are printed circuit boards containing electrical leads for electrically connecting electronic components, and both said boards each have two opposite sides, or major surfaces, and two long parallel edges which extend in the direction of said boards' greatest length;

an elongated edge connector mounted on a first major surface of said mother board adjacent and parallel to one of said mother board's long edges, so that when said edge connector is mated with the bus connector of the computer system the major surfaces and long edges of said mother board extend parallel to the direction of air flow generated by said fan;

means for electrically connecting the electrical leads of said daughter board to those of said mother board and for mounting said daughter board over said mother board so that a first major surface of said daughter board is spaced from, is facing, and is substantially parallel to said first major surface of said mother board, and so that one of the long edges of said daughter board substantially abuts the edge connector and so that the other edge of said daughter board is substantially over the other edge of said mother board, so that for a major portion of the length of said memory module said daughter board covers substantially all of said mother board which is not covered by said edge connector, said connecting means being aligned parallel to the long edges of said daughter board near one or both of those long edges so as to minimize the reduction of air flow between said mother and daughter board caused by such connectors; and memory chips located on the facing major surfaces of said mother and daughter board between the two long edges of said daughter board and between the edge connector and the second edge of said mother board, so that the air flowing between said mother and daughter board will cool said memory chips.

2. A memory module as in claim 1 wherein:

said means for electrically connecting and mounting comprises two parallel rows of mating connectors contained on both said mother and daughter board, said parallel rows being aligned in a direction parallel to said long edges of said two boards, said mating connectors spacing the surface of said daughter board which is closest to said mother board up away from the surface of said mother board by a given amount, so that an air channel for air flow is formed between the facing surfaces of said mother and daughter boards and between the opposing parallel rows of connectors which is parallel to the direction of air flow created by said fan.

3. A memory module as in claim 2, wherein said two parallel rows of connectors extend with the individual connectors of each row closely spaced for a major portion of that part of the length of said daughter board which contains memory chips mounted on its surface which faces said mother board.

4. A memory module as in claim 1, wherein said memory chips on the facing surfaces of both said mother and daughter board are offset relative to each other so that chips on said daughter board are not positioned directly above the chips which face them on said mother board.

5. A memory module as in claim 1, wherein said memory chips are in TSOP packages.

6. A memory module as in claim 1 wherein the side of said daughter board which is furthest away from the first major surface of said mother board sticks up from the first major surface of said mother board by substantially the same amount as does the edge connector.

7. A memory module as in claim 1:

which further includes a bus interface chip mounted on the first a major surface of said mother board, which interfere chip is thicker than the memory chips mounted on the facing major surface of said mother and daughter boards; and wherein said daughter board does not cover the portion of said mother board on which the bus interface chip is mounted, but said bus interface chip is mounted in a portion of said motherboard which is in line with the air flow between said mother board and said daughter board.

8. A memory module as in claim 7 wherein said daughter board overlaps the major portion of said mother board's first major surface except the part of it which is covered by said edge connector and the bus interface chip.

9. A memory module as in claim 6 wherein said means for electrically connecting and for mounting said daughter board is comprised of a plurality of pairs of opposing, mating electrical connectors, each of which paris includes a socket on one of said boards and an opposing, mating pin on the other of said boards, and each of which pins and sockets is physically connected to its associated one of said boards and is electrically connected to the lead is that board.

10. A memory module as in claim 9 wherein said electrical connectors connected to said daughter board are through-hole connectors which contain portions which extend through said daughter board, and wherein portions of the connectors which extend through said daughter board out past its surface which is furthest away from the first major surface of said mother board have been filed down to prevent any portion of said daughter board from sticking up from said mother board by substantially any more than said given height of said edge connector.

11. A memory module as in claim 6 wherein said daughter board has no chips mounted on its side which is furthest away from the first major surface of said mother board.

12. A memory module comprising:
a mother board having two chip bearing surfaces and having memory chips mounted on each of those two surfaces, which memory chips all have corresponding input and/or outputs;
a daughter board having one chip bearing surface and having memory chips mounted on that chip bearing surface;
connecting means for electrically connecting and physically attaching said mother and daughter boards;
input and output drivers on said mother board for driving signals to and from said memory chips and
for each of a plurality of said input or output drivers, an electrical conductor having three separate branches, one associated with the memory chips on each of said three chip bearing surfaces, each such branch being electrically connected to said input or output driver and to a corresponding input or output of each of said memory chips mounted on its associated chip bearing surface, said branch which si connected to memory chips on said daughter board making an electrical connection through said connecting means, and each of said three branches having approximately the same impedance, so the timing characteristics of the signals on each are approximately the same.

13. A memory module designed for use in a computing system which contains a system bus containing elongated bus connectors with which memory cards can be mated to electrically connect them to the bus, and a fan for generating an air flow in a direction parallel to the elongated dimension of said edge connectors, said memory module comprising:
a mother board;
a daughter board;
where both said mother and daughter boards are printed circuit boards containing electrical leads for electrically connecting electronic components, and both said boards each have two opposite sides, or major surfaces, and two long substantially parallel edges;
an elongated edge connector on said mother board along one of said mother board's parallel edges, so that when said edge connector is mated with the bus connector of the computer system the major surfaces and long edges of said mother board extend parallel to the direction of air flow generated by said fan;
memory chips located on the facing major surfaces of said mother and daughter board between the two long edges of said daughter board and between the edge connector and the second edge of said mother board, said memory chips on both the facing major surfaces of said mother and daughter boards being arranged in a row extending parallel to said elongated edge connector; and
means for electrically connecting the electrical leads of said daughter board to those of said mother board and for mounting said daughter board over said mother board so that said the row of chips on said daughter board is facing, spaced from, and substantially parallel to said flow of chips on said mother board, said connecting means comprising two parallel rows of mating connectors, said rows of mating connectors extending parallel to, and being located on each side of, the facing rows of chips on the mother and daughter boards;
wherein said mother and daughter board and said two rows of connectors form a channel for the fan generated air flow which helps channel that air flow along and between said two rows of acing chips when said memory module's edge connector is mated with the bus connector of the computer system.

14. A memory module as in claim 13;
further including a bus interface chip which generates substantially more heat than any one of said memory chips;
wherein said bus interface chip is mounted on said mother board in line with said row of memory chips on said mother board, after those chips in the direction of said air flow when said memory module's edge connector is mated with said bus connector, so that the air which flows through said channel formed by said mother and daughter boards and said two rows of mating connectors id directed toward said bus interface chip after it has passed said two facing rows of memory chips; and
wherein said daughter board does not cover the portion of the mother board on which the bus interface chip is mounted.

* * * * *